United States Patent
Hamada et al.

(10) Patent No.: US 8,975,725 B2
(45) Date of Patent: Mar. 10, 2015

(54) BIAS CIRCUIT AND METHOD OF MANUFACTURING THE SAME

(75) Inventors: Yasuhiro Hamada, Tokyo (JP); Shuya Kishimoto, Tokyo (JP); Kenichi Maruhashi, Tokyo (JP)

(73) Assignee: NEC Corporation, Tokyo (JP)

( * ) Notice: Subject to any disclaimer, the term of this patent is extended or adjusted under 35 U.S.C. 154(b) by 219 days.

(21) Appl. No.: 13/129,344

(22) PCT Filed: Dec. 1, 2009

(86) PCT No.: PCT/JP2009/006517
§ 371 (c)(1),
(2), (4) Date: May 13, 2011

(87) PCT Pub. No.: WO2010/064412
PCT Pub. Date: Jun. 10, 2010

(65) Prior Publication Data
US 2011/0221032 A1     Sep. 15, 2011

(30) Foreign Application Priority Data

Dec. 4, 2008     (JP) ................... 2008-309555

(51) Int. Cl.
*H01L 29/00*     (2006.01)
*H01L 23/522*     (2006.01)
(Continued)

(52) U.S. Cl.
CPC ........ *H01L 23/5227* (2013.01); *H01L 23/5225* (2013.01); *H01L 23/66* (2013.01); *H03F 1/301* (2013.01); *H03F 3/195* (2013.01); *H01L 27/0676* (2013.01); *H01L 2223/6644* (2013.01);
(Continued)

(58) Field of Classification Search
CPC ............ H01L 23/5227; H01L 23/5228; H01L 2924/19042; H01L 23/5222; H01L 23/522; H01L 23/5225; H01L 23/645
USPC .................... 257/528, 531, 536–538
See application file for complete search history.

(56) References Cited

U.S. PATENT DOCUMENTS 5,446,311 A * 8/1995 Ewen et al. ................... 257/531
5,610,433 A * 3/1997 Merrill et al. ................. 257/531
(Continued)

FOREIGN PATENT DOCUMENTS

| JP | 63-48855 A | 3/1988 |
| JP | 1-223758 A | 9/1989 |

(Continued)

OTHER PUBLICATIONS

International Search Report for PCT/JP2009/006517 mailed Jan. 12, 2010.

*Primary Examiner* — Ori Nadav
(74) *Attorney, Agent, or Firm* — Sughrue Mion, PLLC

(57) ABSTRACT

A bias circuit according to the present invention includes a resistor layer 2 which is placed above a substrate 1 and connected to a ground potential, and a conductor 4 for forming an inductor 5 placed above the resistor layer 2. Further, a manufacturing method of the bias circuit according to the present invention generates the resistor layer 2 above the substrate 1 and is connected to the ground potential, and generates the conductor 4 for forming the inductor 5 above the resistor layer 2. The present invention can provide a bias circuit and a manufacturing method of the bias circuit that enables easy integration on a semiconductor substrate and prevents parasitic oscillation.

15 Claims, 7 Drawing Sheets

(51) Int. Cl.
*H01L 23/66* (2006.01)
*H03F 1/30* (2006.01)
*H03F 3/195* (2006.01)
*H01L 27/06* (2006.01)

(52) U.S. Cl.
CPC ... *H01L 2223/665* (2013.01); *H01L 2223/6655* (2013.01); *H01L 2924/3011* (2013.01); *H03F 2200/18* (2013.01); *H03F 2200/222* (2013.01); *H03F 2200/255* (2013.01); *H03F 2200/387* (2013.01); *H03F 2200/423* (2013.01); *H01L 2924/0002* (2013.01)
USPC .......................... 257/531; 257/528; 257/536

(56) References Cited

U.S. PATENT DOCUMENTS

| | | | |
|---|---|---|---|
| 5,656,849 A * | 8/1997 | Burghartz et al. | 257/528 |
| 5,959,522 A * | 9/1999 | Andrews | 336/200 |
| 6,031,445 A * | 2/2000 | Marty et al. | 336/200 |
| 6,037,649 A * | 3/2000 | Liou | 257/531 |
| 6,287,932 B2 * | 9/2001 | Forbes et al. | 438/381 |
| 6,380,608 B1 * | 4/2002 | Bentley | 257/531 |
| 6,452,249 B1 * | 9/2002 | Maeda et al. | 257/531 |
| 6,593,838 B2 * | 7/2003 | Yue | 336/84 C |
| 6,833,603 B1 * | 12/2004 | Park et al. | 257/528 |
| 6,900,716 B2 * | 5/2005 | Ahn et al. | 336/200 |
| 7,173,318 B2 * | 2/2007 | Liu et al. | 257/531 |

FOREIGN PATENT DOCUMENTS

| | | |
|---|---|---|
| JP | 9-162354 A | 6/1997 |
| JP | 11-308059 A | 11/1999 |
| JP | 2000188373 A | 7/2000 |
| JP | 2002305110 A | 10/2002 |
| JP | 2008205403 A | 9/2008 |

* cited by examiner

BIAS CIRCUIT AND METHOD OF MANUFACTURING THE SAME

The present application is the National Phase of PCT/JP2009/006517, filed Dec. 1, 2009, which claims priority rights of and is based on Japanese Patent Application No. 2008-309555 filed on Dec. 4, 2008 in the Japanese Patent Office, the entire contents of which are hereby incorporated by reference.

TECHNICAL FIELD

The present invention relates to a bias circuit and a method of manufacturing the same, which is integrated on a semiconductor substrate.

BACKGROUND ART

The high frequency characteristics of a MOSFET have improved in connection with microfabrication process of the CMOS in recent years, and consequently a high frequency amplifier can be realized. In the high frequency amplifier, it is important to match the impedance of input and output in a desired band and to stable a circuit outside the desired band.

FIG. 11 is a circuit diagram of a source grounded FET type amplifier. A signal input from an input terminal 12 passes through a DC block capacitor 13a, and reaches the gate of an FET 15 via a transmission line 14a. A short stub 18a composed of a transmission line 16a and a capacitor 17a with one side grounded is connected to the transmission line 14a and the capacitor 13a, and these form an input matching circuit. A gate bias supply terminal 19 is connected to the short stub 18a, and supplies bias to the gate of the FET 15.

Further, the drain of the FET 15 is connected to the DC blocking capacitor 13b via a transmission line 14b, and the drain of the FET 15 outputs a signal to an output terminal 21. A short stub 18b composed of a transmission line 16b and a capacitor 17b with one side grounded is connected to a transmission line 14b and a capacitor 13b, and these form an output matching circuit. A drain bias supply terminal 22 is connected to the short stub 18b, and supplies bias to the drain of the FET 15.

In this amplifier, impedance matching is performed by the transmission lines 14a and 14b and the short stubs 18a and 18b, and the amplifier also functions as a bias circuit. As a result, according to a simulation result (not shown) of small signal characteristics, gain will be maximum and reflective properties will also be minimum near 60 GHz. Accordingly, impedance of input and output is matched in a desired band.

By the way, generally a k factor derived from an S parameter is used as an index of stabilization. In order for the circuit to be stable, a condition of k>1 is necessary. A calculation result of the frequency characteristics of the k factor of an amplifier of FIG. 11 is shown in FIG. 12. According to FIG. 12, the k factor of the amplifier of FIG. 11 is k<1 in the frequency of 2 GHz or less. There is a possibility of being instable in this frequency region such that the circuit oscillates.

Further, as a method to solve such problem of instability in a low frequency region, there is a known method of incorporating a shunt RC circuit composed of a resistor element and a capacitive element in a bias circuit. FIG. 13 is a circuit diagram showing such a bias circuit. A shunt RC circuit 11 is inserted between a short stub 18 which makes a part of the matching circuit, and a bias supply terminal 31. Since a low frequency signal which cannot be grounded by a capacitor of the short stub passes through a large capacitive element of a stable circuit and attenuates by a resistor element, the amplifier is stabilized.

Moreover, in order to solve such problem of instability, in a high frequency amplifying device according to PTL 1, an active element and a matching circuit for the active element are used. That is, a resistive component of input impedance of the active element is made small enough so that a stable index k factor in the single active element will be one or less in a frequency band using the amplifying device. Then, a stability index k factor as the amplifying device is set to be one or more using a loss of the matching circuit.

Further, PTL 2 discloses a technique concerning a spiral inductor that can reduce parasitic resistance between an inductor and a substrate when forming the inductor using a wiring layer on a silicon process. Technique concerning the spiral inductor is disclosed also in PTL 3 and 4.

CITATION LIST

Patent Literature

PTL 1: Japanese Unexamined Patent Application Publication No. 11-308059
PTL 2: Japanese Unexamined Patent Application Publication No. 2000-188373
PTL 3: Japanese Unexamined Patent Application Publication No. 2002-305110
PTL 4: Japanese Unexamined Patent Application Publication No. 2008-205403

SUMMARY OF INVENTION

Technical Problem

However, there are some problems in the bias circuit shown in FIG. 13. The first problem is the point of increasing cost of the chip. The reason is that as the capacitance which should be mounted on the shunt RC circuit is large, for example from 5 to 10 pF, the chip area is increased. The second problem is the point that there is a possibility of changing the characteristics of an amplifier in a desired band. The reason is that as the capacitive component of the shunt RC circuit is connected in parallel to the capacitive element of a short stub, this will influence the frequency characteristics of the matching circuit. Therefore, the purpose of the present invention is to provide a bias circuit that can achieve easy integration on a semiconductor substrate and prevent parasitism oscillation.

Solution to Problem

A bias circuit according to the present invention includes a resistor layer that is placed over a substrate and connected to a ground potential, and a conductor that is placed above the resistor layer apart from the resistor layer and forms an inductor.

Further, a manufacturing method of a bias circuit according to the present invention includes generating a resistor layer that is connected to a ground potential over a substrate, and generating a conductor for forming an inductor above the resistor layer apart from the resistor layer.

Advantageous Effects of Invention

By the present invention, it is possible to provide a bias circuit which enables easy integration on a semiconductor substrate and prevents parasitism oscillation.

DESCRIPTION OF EMBODIMENTS

First Exemplary Embodiment

Hereinafter, a first exemplary embodiment of the present invention is explained with reference to the drawings.

Figure 1:
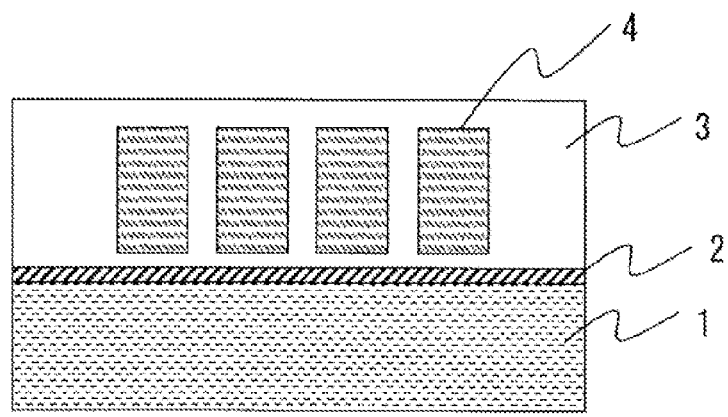
FIG. 1 is a cross-sectional diagram of a an element which composes a bias circuit according to a first exemplary embodiment.
Figure 2:
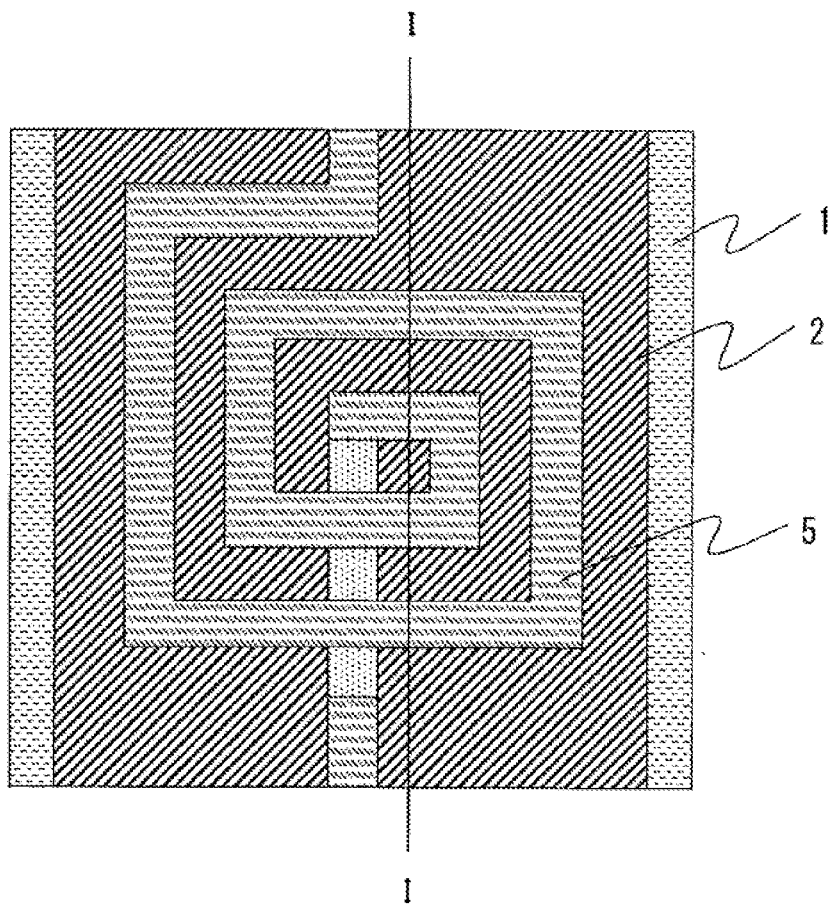
FIG. 2 is a plan view of the element which composes the bias circuit according to the first exemplary embodiment.

A cross-sectional diagram of the first exemplary embodiment is shown in FIG. 1, and a plan view is shown in FIG. 2. FIG. 1 is a cross-sectional diagram taken along the line I-I of FIG. 2. A bias circuit according this exemplary embodiment includes a resistor layer 2 which is placed over a substrate 1 and connected to a ground potential, and a conductor 4 which forms an inductor 5 above the resistor layer 2.

The resistor layer 2 can be obtained by forming a diffusion region, for example in the CMOS process. In addition, the resistor layer 2 may be formed of, for example, a NiCr thin film resistor, and the one with resistivity such as metal, polysilicon, and an alloy. The resistor layer 2 is connected to the ground potential at the place not shown in the drawings.

Further, an insulator 3 may be placed above the resistor layer 2, and the conductor 4 which forms the inductor 5 is placed inside the insulator 3. In order to simplify the configuration diagram, a gate insulating film and an interlayer, insulating film of a wiring part are integrated and denoted as the insulator 3.

Figure 3:
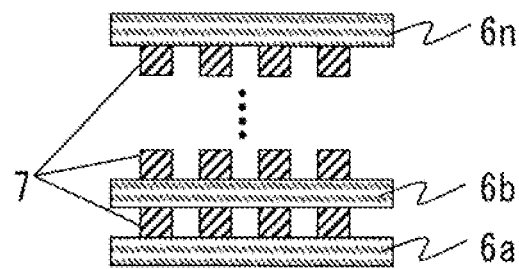
FIG. 3 is a view showing a detailed configuration of a conductor which composes the inductor of the element which composes the bias circuit according to the first exemplary embodiment.

A specific configuration of the conductor 4 which forms the spiral inductor 5 is shown in FIG. 3. The conductor 4 is composed by connecting all the metal layers from a bottom layer 6a to a top layer 6n by many vias 7 in a multilayer metal wiring process. That is, the spiral inductor 5 is formed for every metal layer, and the spiral inductor in each metal layer is connected by the vias 7. The conductor 4 of FIG. 1 simplifies and shows this.

The distance between the bottom layer of the metal layer 6a and the resistor layer 2 is manufactured to be short in the CMOS process, in order to reduce the signal delay in the wiring part. This distance is approximately 1 μm or less. As described above, since the distance between the bottom layer of the metal layer 6a, which is a lower surface of the inductor, and the diffusion region 2, which is a resistor, is short, the parasitic capacitance therebetween is large. Note that the inductor 5 of this exemplary embodiment is not only spiral inductor structure but may be a meander shaped inductor, for example.

Moreover, when an alternating current signal is applied to this inductor, eddy current is generated in the resistor layer 2. In this resistor layer 2, the eddy current is converted into Joule heat and will be a loss of the alternating current signal. Since the current path connecting the resistor layer 2 and the ground potential exists, current is generated by a potential difference from the ground potential, and will be a loss of the alternating current signal. Accordingly, these effects are expressed as the parasitic resistance connected to the ground potential.

Figure 4:
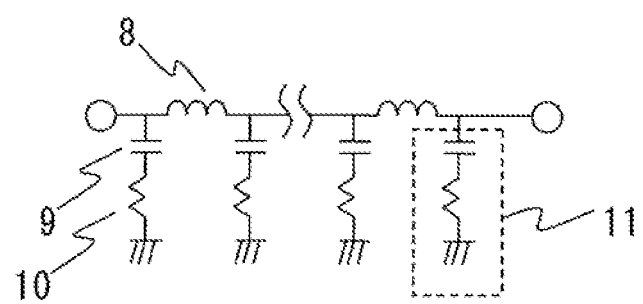
FIG. 4 is a circuit diagram of an equivalent circuit of the bias circuit according to the first exemplary embodiment.

An equivalent circuit of inductor according to this exemplary embodiment including the abovementioned parasitic capacitance and the parasitic resistance is expressed as shown in FIG. 4. The equivalent circuit is composed by distributed constant inductance 8, parasitic capacitance 9, and parasitic resistance 10. Note that an equivalent shunt RC circuit 11 exists in this inductor.

Therefore, the parasitic capacitance is generated between the spiral inductor 5 and the resistor layer 2. Further, a magnetic field is generated vertically to the substrate by the alternating current signal which passes through the inductor 5, and eddy current is induced by the resistor layer 2 through which a magnetic field penetrates. Attenuation of the eddy current in the resistor layer 2 will be a loss for the alternating current signal which passes through the inductor. As mentioned above, the equivalent shunt RC circuit is formed. Then, it is possible to provide a bias circuit which enables an easy integration on a semiconductor substrate and prevents parasitism oscillation.

Additionally, the bias circuit according to this exemplary embodiment is manufactured as follows. The resistor layer 2 is formed over the substrate 1. A general processing method represented by the vapor deposition method, the sputtering method, plating, diffusion, alloying, or the damascene process may be used for the manufacturing method. This resistor layer 2 is connected to the ground potential by the general processing method represented above. Next, the conductor 4 which forms the inductor is formed above the resistor layer 2. The general processing method represented above may be used also for the manufacturing method. By the manufacturing method of the bias circuit according to this exemplary embodiment, it is possible to manufacture the bias circuit which enables easy integration on the semiconductor substrate and prevents parasitism oscillation.

The insulator 3 is formed between the resistor layer 2 and the conductor 4. The insulator 3 is formed by methods, such as oxidization of a silicon substrate, the vapor deposition method, and the chemical vapor deposition (CVD) method. The conductor 4 may be formed after forming the insulator 3, or the insulator 3 and the conductor 4 may be formed using the multilayer interconnection process.

The input and output terminals of the inductor 5 and the circuits are connected using the general processing method represented above.

Note that by appropriately adjusting the manufacturing condition of the insulator 3, which is represented by time and temperature of oxidization, vapor deposition, and CVD, the gap between the resistor layer 2 and the lower surface of the conductor 4 can be approximately 1 μm or less.

By the manufacturing method of the bias circuit as above, it is possible to manufacture the bias circuit that enables easy integration on the semiconductor substrate and prevents parasitism oscillation.

Figure 5:
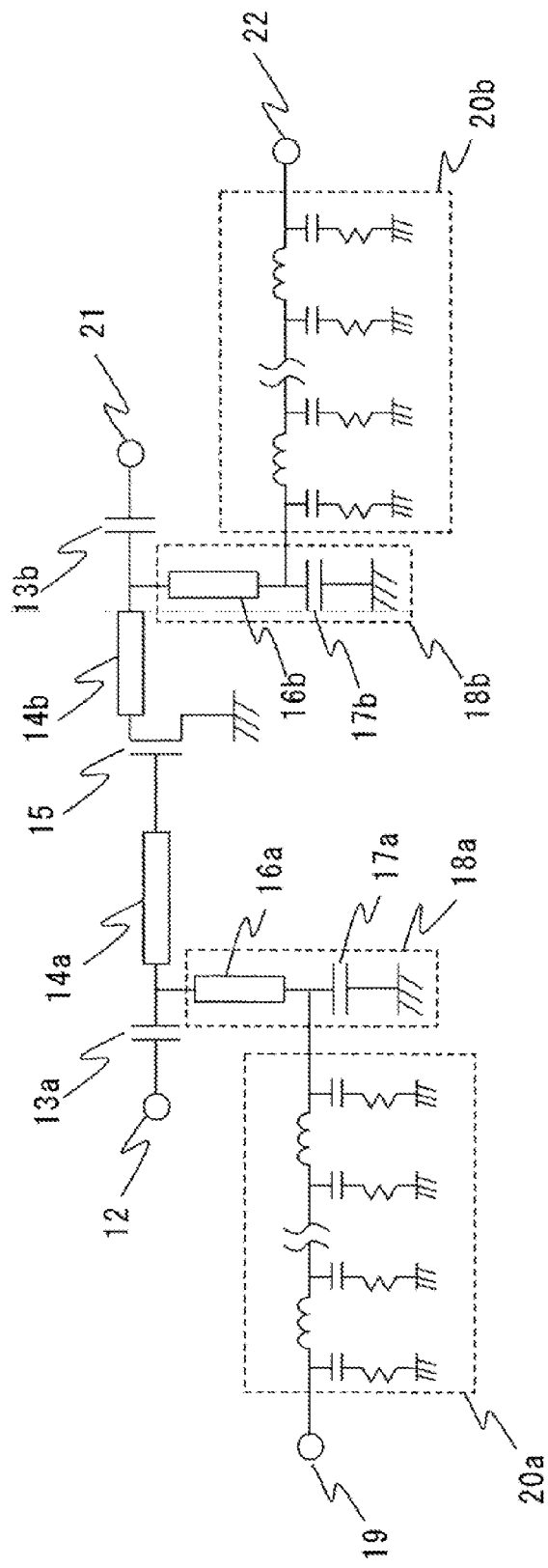
FIG. 5 is a circuit diagram when the bias circuit according to the first exemplary embodiment is used for a 60 GHz band amplifier.

The circuit diagram of a 60 GHz band amplifier incorporating this spiral inductor into the bias circuit is shown in FIG. 5. In this circuit, input terminals of inductors 20a and 20b are connected to power supplies (bias supply terminals) 19 and 22, and output terminals of the inductors are connected to short stubs 18a and 18b which are power supply units of an integrated circuit.

In the amplifier shown in FIG. 5, a signal input from an input terminal 12 passes through a DC blocking capacitor 13a, and reaches the gate of an FET 15 via a transmission line 14a. The short stub 18a which is composed of a transmission line 16a and a capacitor 17a with one side grounded is connected to the transmission line 14a and the capacitor 13a, and these form an input matching circuit. The gate bias supply terminal 19 is connected to the short stub 18a via the inductor 20a, which is indicated by the equivalent circuit of FIG. 4, and supplies bias to the gate of the FET 15.

Moreover, the drain of the FET 15 is connected to a DC blocking capacitor 13b via a transmission line 14b, outputs a signal to an output terminal 21. The short stub 18b which is composed of a transmission line 16b and a capacitor 17b with one side grounded is connected to the transmission line 14b and the capacitor 13b, and these form an output matching circuit. The drain bias supply terminal 22 is connected to the short stub 18b, which is indicated by the equivalent circuit of FIG. 4, and supplies bias to the drain of the FET 15.

Figure 6:
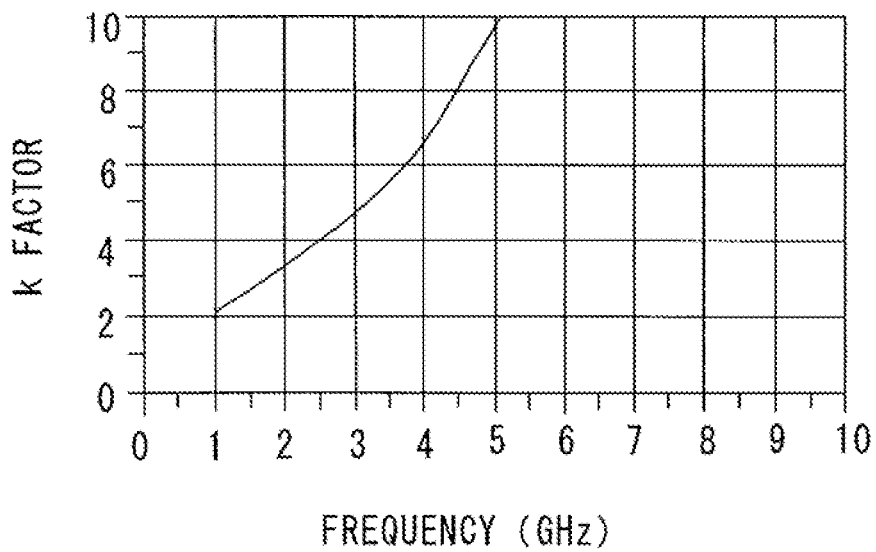
FIG. 6 is a view showing frequency characteristics of a .k factor of the 60 GHz band amplifier according to the first exemplary embodiment.

The low frequency region is stabilized by the equivalent shunt RC circuit of the spiral inductors 20a and 20b included in the bias circuit according to this exemplary embodiment. When the simulation result of the frequency characteristics of the k factor in the low frequency band of this amplifier is shown in FIG. 6, it is k>1 and stabilization can be confirmed.

Figure 7:
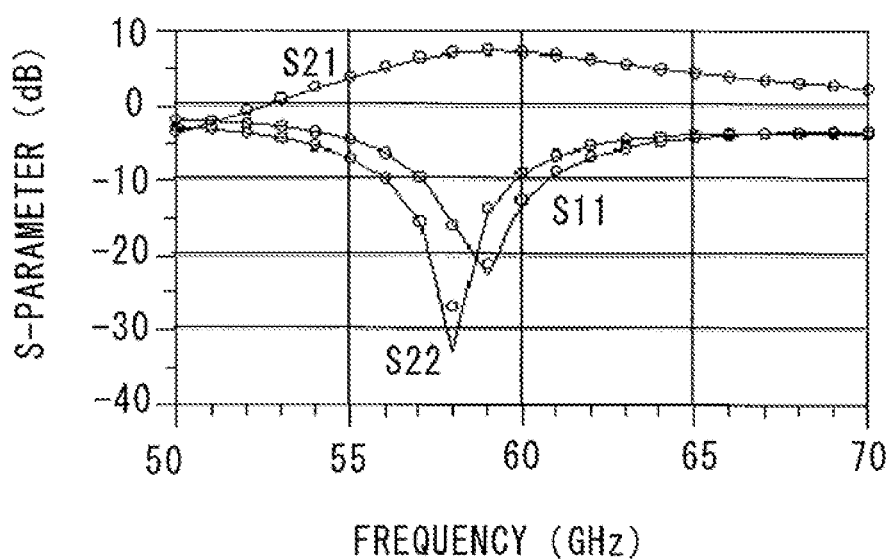
FIG. 7 is a view showing small signal characteristics of the 60 GHz band amplifier according to the first exemplary embodiment.
Figure 11:
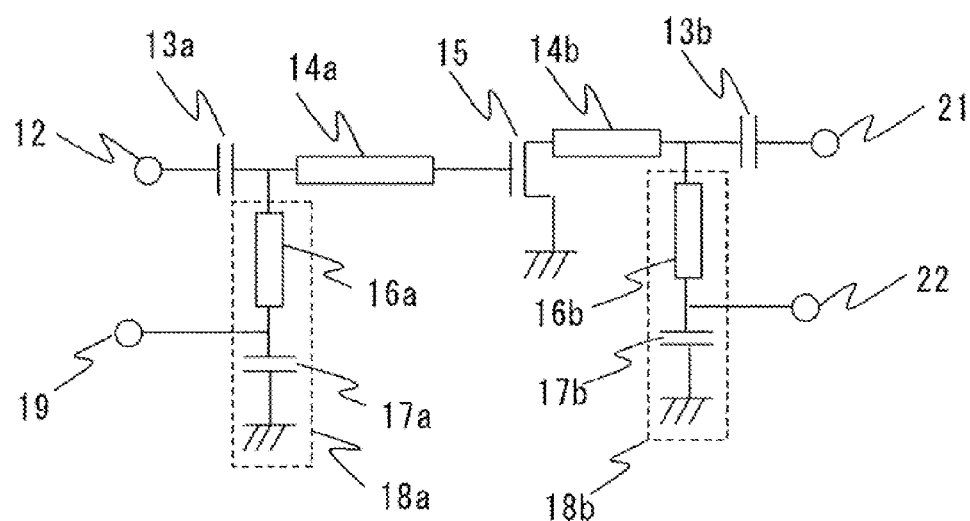
FIG. 11 is a circuit diagram of a source grounded FET type amplifier.
Figure 12:
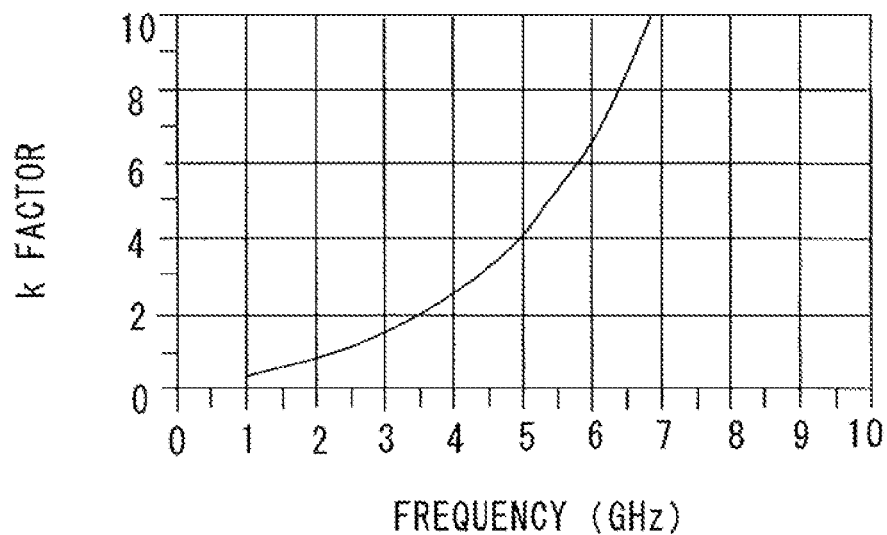
FIG. 12 is a view showing frequency characteristics of a k factor of the source grounded FET type amplifier.
Figure 13:
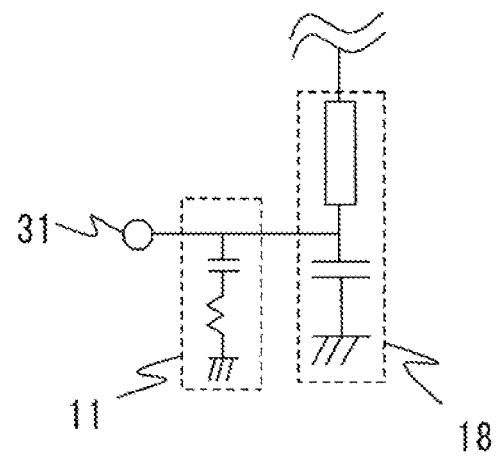
FIG. 13 is a circuit diagram of a bias circuit using a shunt RC circuit.

The simulation result of the small signal characteristics of 60 GHz band, which is a desired band, of the amplifier according this exemplary embodiment shown in FIG. 5 is indicated by the solid line of FIG. 7. Further, the simulation result of the amplifier of FIG. 11 not including the spiral inductor is shown by the points of FIG. 7. From these results, it can be said that the simulation result of the amplifier according to this exemplary embodiment and the simulation result of the amplifier of FIG. 11 not including the spiral inductor are almost the same. Since the inductance of the spiral inductor will be high impedance for a high frequency signal, the stabilization of the low frequency region can be achieved in a state of small influence on the characteristics of the desired band.

That is, by the inductance of the spiral inductor, a low frequency signal which cannot be grounded by the short stub attenuates through the shunt .RC circuit even in a state that the shunt RC circuit does not influence the matching circuit in the desired frequency. Accordingly, it is possible to provide the bias circuit in which the circuit is stabilized by low frequency.

Second Exemplary Embodiment

Figure 8:
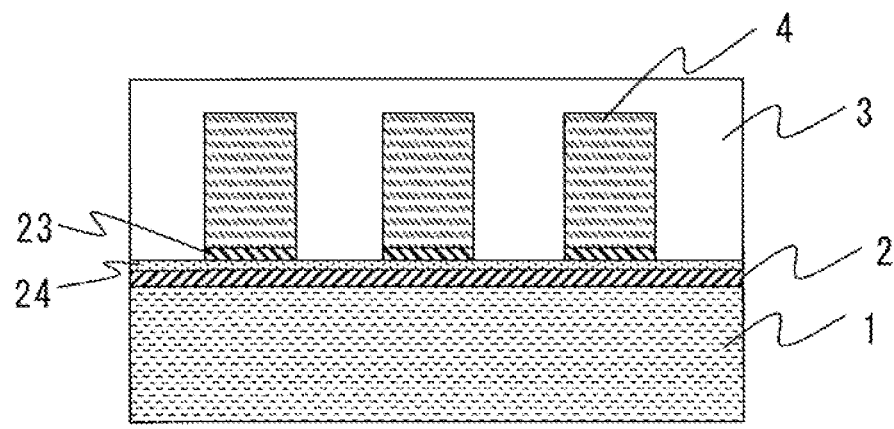
FIG. 8 is a cross-sectional diagram of an element which composes a bias circuit according to a second exemplary embodiment.

Next, a second exemplary embodiment of the present invention is explained using the cross-sectional diagram shown in FIG. 8. Note that similar components as the first exemplary embodiment shown in FIG. 1 are denoted by the same numerals, and duplicate explanation is omitted. Moreover, an equivalent circuit of a bias circuit according to the second exemplary embodiment is similar to the one shown in FIG. 4, and the circuit diagram of a 60 GHz band amplifier incorporating the bias circuit according to the second exemplary embodiment is also similar to the one shown in FIG. 5.

The lower part of the conductor 4 which forms the spiral inductor is connected to polysilicon 23 formed in the CMOS process by the via which is not shown in the drawings. In the CMOS process, the polysilicon 23 is formed over a thin gate insulating film 24 of about a few tens of nm, and a gate insulating film 24 is formed over the resistor layer (diffusion region) 2.

In this exemplary embodiment, the distance between the resistor layer 2 and the lower surface of the inductor is about several tens of nanometers, which is the film thickness of the gate oxide film, and it is shorter than approximately 1 μm in the first exemplary embodiment, thus coupling is larger. Accordingly, as the effect of the eddy current becomes larger than the first exemplary embodiment, better stability than the first exemplary embodiment can be obtained. Further, the polysilicon may be alloyed polysilicon.

Third Exemplary Embodiment

Figure 9:
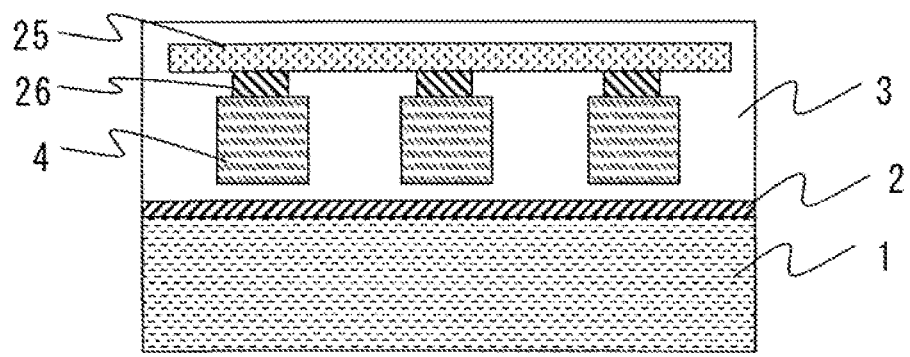
FIG. 9 is a cross-sectional diagram of an element which composes a bias circuit according to a third exemplary embodiment.

Next, a third exemplary embodiment of the present invention is explained using the cross-sectional diagram shown in FIG. 9. Note that similar components as the first exemplary embodiment shown in FIG. 1 are denoted by the same numerals, and duplicate explanation is omitted. Further, an equivalent circuit of a bias circuit according to the third exemplary embodiment is similar to the one shown in FIG. 4, and the circuit diagram of a 60 GHz band amplifier incorporating the bias circuit according to the third exemplary embodiment is also similar to the one shown in FIG. 5.

The bias circuit according to this exemplary embodiment places the conductor 4 which forms the spiral inductor under the pad 25 for bias power supply. It is clear that the effect equivalent to the first exemplary embodiment is achieved by this mode. In this exemplary embodiment, since it is not necessary to ensure the area only for the inductor in a chip, the chip area is reduced, and consequently producing a synergistic effect of contributing to reduction of chip cost.

Furthermore, in addition that the conductor for forming the inductor is connected to the via 7, the pad 25 and the conductor 4 are connected by the via 26 for pad, there is an effect produced that the mechanical strength of the pad improves.

Fourth Exemplary Embodiment

Figure 10:
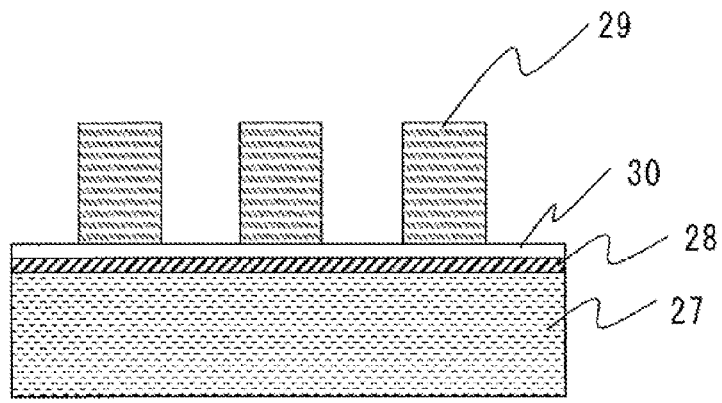
FIG. 10 is a cross-sectional diagram of an element which composes a bias circuit according to a fourth exemplary embodiment.

Next, a fourth exemplary embodiment of the present invention is explained using the cross-sectional diagram shown in FIG. 10. Note that similar components as the first exemplary embodiment shown in FIG. 1 are denoted by the same numerals, and duplicate explanation is omitted. Further, an equivalent circuit of a bias circuit according to the fourth exemplary embodiment is similar to the one shown in FIG. 4, and the circuit diagram of a 60 GHz band amplifier incorporating the bias circuit according to the fourth exemplary embodiment is also similar to the one shown in FIG. 5.

The bias circuit according to this exemplary embodiment includes an NiCr thin film resistor layer 28 formed over a GaAs substrate 27. This NiCr thin film resistor layer 28 is connected to a ground potential at the place not shown in the drawings. The spiral inductor formed of gold plating 29 exists above the NiCr thin film resistor layer 28, and a SiN insulating film 30 is formed between the spiral inductor and the thin film resistor layer 28. It is clear that effect equivalent to the first exemplary embodiment is obtained by this mode.

The present invention is not limited to the above exemplary embodiments, but can be appropriately modified without departing from the scope.

In each of the abovementioned embodiments, the substrate is not limited to neither a silicon substrate nor a GaAs substrate, but for example, may be a Silicon on Insulator substrate (SOI substrate) and a substrate using other compound semiconductors, such as InP, or an insulator represented by alumina.

Additionally, the process is not limited to the CMOS process, but may be other silicon IC processes represented by the SiGe process and the bipolar process.

Further, the conductors 6a to 6n (see FIG. 3) which compose the wiring in each embodiment do not necessarily need connections by the vias 7 at all the places, however, for example, it may be a configuration of connecting the vias 7 at only appropriate places in the spiral inductor. Furthermore, each conductor may be in the form of mesh.

In order to explain the effect, the 60 GHz amplifier is used as an example, however it is not limited to the 60 GHz band, and not limited to the amplifier, but can be applied to a bias circuit of a functional circuit which includes an active element.

Industrial Applicability

The present invention can be widely applied to the field of the electronic equipment using the bias circuit integrated on the semiconductor substrate.

REFERENCE SIGNS LIST

1 SUBSTRATE
2 RESISTOR LAYER (DIFFUSION REGION)
3 INSULATOR
4 CONDUCTOR
5 SPIRAL INDUCTOR
6a, 6b, and 6n METAL LAYER
7 VIA
8 DISTRIBUTED CONSTANT INDUCTANCE
9 PARASITIC CAPACITANCE
10 PARASITIC RESISTANCE
11 SHUNT RC CIRCUIT
12 INPUT TERMINAL
13a and 13b DC BLOCKING CAPACITOR
14a, 14b, 16a, and 16b TRANSMISSION LINE
15 FET
17a and 17b CAPACITOR WITH ONE SIDE GROUNDED
18, 18a, and 18b SHORT STUB
19 GATE BIAS SUPPLY TERMINAL
20a and 20b EQUIVALENT CIRCUIT OF INDUCTOR
21 OUTPUT TERMINAL
22 DRAIN BIAS SUPPLY TERMINAL
23 POLYSILICON
24 GATE INSULATING FILM
25 PAD FOR BIAS POWER SUPPLY
26 VIA FOR PAD
27 GaAs SUBSTRATE
28 NiCr THIN FILM RESISTOR LAYER
29 GOLD PLATE
30 SiN INSULATING FILM
31 BIAS SUPPLY TERMINAL

The invention claimed is:

1. A high frequency amplifier comprising:
an FET amplifying a high frequency signal supplied to a gate and outputting an amplified high frequency signal from a drain;
a first bias circuit supplying a gate bias to the gate of the FET; and
a second bias circuit supplying a drain bias to the drain of the FET,
wherein each of the first bias circuit and the second bias circuit comprise:
a resistor layer that is placed over a substrate and connected to a ground potential;
an insulator that is placed above the resistor layer;
a conductor that is placed above the insulator and forms an inductor; and
a shunt RC circuit that is formed between an input terminal and an output terminal of the inductor,
wherein the shunt RC circuit comprises a parasitic capacitance that is generated by the conductor and the resistor layer, and a parasitic resistance that is generated by an eddy current induced in the resistor layer when an alternating current signal is applied to the conductor,
wherein an output terminal of the first bias circuit is connected to the gate of the FET and the gate bias is supplied to an input terminal of the first bias circuit, and
wherein an output terminal of the second bias circuit is connected to the drain of the FET and the drain bias is supplied to an input terminal of the second bias circuit.

2. The high frequency amplifier according to claim 1, wherein an input terminal of the inductor is connected to a power supply, and an output terminal of the inductor is connected to a power supply unit of an integrated circuit.

3. The high frequency amplifier according to claim 1, wherein the inductor is formed by connecting each of a plurality of metal layers by a via.

4. The high frequency amplifier according to claim 1, wherein the inductor is formed by connecting a polysilicon layer and the plurality of metal layers by a via.

5. The high frequency amplifier according to claim 1, wherein the wire of the inductor is formed of gold.

6. The bias circuit according to claim 1, wherein the inductor is placed below a pad which supplies bias and is connected to the pad by the via.

7. The high frequency amplifier according to claim 1, wherein the substrate is silicon.

8. The high frequency amplifier according to claim 1, wherein the substrate is a Silicon-on-Insulator substrate.

9. The high frequency amplifier according to claim 1, wherein the substrate is a compound semiconductor.

10. The high frequency amplifier according to claim 1, wherein the substrate is ceramic.

11. The high frequency amplifier according to claim 1, wherein the resistor layer is formed in a silicon IC process.

12. The high frequency amplifier according to claim 1, wherein the resistor layer is a thin metal film resistor.

13. The high frequency amplifier according to claim 1, wherein the insulator placed above the resistor is silicon nitride.

14. The high frequency amplifier according to claim 1, wherein the insulator placed above the resistor layer is oxide silicon.

15. The high frequency amplifier according to claim 1, wherein the resistor layer is an unpatterned layer.

* * * * *